US008847147B2

(12) United States Patent
Wu

(10) Patent No.: US 8,847,147 B2
(45) Date of Patent: Sep. 30, 2014

(54) OPTICAL-ELECTRICAL MODULE WITH METAL FILM FOR PREVENTING EMI LEAKAGE

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 162 days.

(21) Appl. No.: 13/446,246

(22) Filed: Apr. 13, 2012

(65) Prior Publication Data

US 2013/0146752 A1 Jun. 13, 2013

(30) Foreign Application Priority Data

Dec. 7, 2011 (TW) ............................. 100145007 A

(51) Int. Cl.
*H01L 31/147* (2006.01)

(52) U.S. Cl.
USPC ............................ 250/239; 398/139; 250/216

(58) Field of Classification Search
CPC ................................ H04B 10/40; H04B 10/43
USPC ........................... 250/216, 221, 239; 398/139
See application file for complete search history.

(56) References Cited

U.S. PATENT DOCUMENTS

| | | | |
|---|---|---|---|
| 7,338,216 B2 * | 3/2008 | Burdick et al. | 385/88 |
| RE41,147 E * | 2/2010 | Pang et al. | 398/139 |
| 8,251,601 B2 * | 8/2012 | Huang et al. | 396/529 |

* cited by examiner

*Primary Examiner* — Tony Ko
(74) *Attorney, Agent, or Firm* — Novak Druce Connolly Bove + Quigg LLP

(57) ABSTRACT

An optical-electrical module includes a base board, a laser diode, an integrated circuit, and a lens unit. The laser diode and the integrated circuit are both fixed on the base board. The lens unit and the base board cooperatively define a receiving space to receive the laser diode and the integrated circuit. The laser diode has a transmitting window at an end of the laser diode away from the base board. The integrated circuit drives the laser diode to transmit optical signals. The lens unit has an inner surface facing the base board, and the inner surface of the lens unit has a light transmitting area. The lens unit includes a metal film formed on the inner surface of the lens unit except on the light transmitting area.

13 Claims, 4 Drawing Sheets

100 715 713 711 70 71 73 77 717 402 40 14 30 12 10 75

OPTICAL-ELECTRICAL MODULE WITH METAL FILM FOR PREVENTING EMI LEAKAGE

BACKGROUND

1. Technical Field

The present disclosure relates to optical-electrical modules, particularly to an optical-electrical module for data transmission.

2. Description of Related Art

An optical-electrical module for data transmission may include a laser diode, an integrated circuit for driving the laser diode to transmit optical signals, and a lens unit for converging and transmitting the optical signals. The optical-electrical module generates electromagnetic interference (EMI) to other electronic components. The optical-electrical module may be covered by a metal housing to shield other electric components from EMI. As a result, the optical-electrical module takes up an inordinate amount of space and the manufacturing cost of the optical-electrical module is thereby increased.

Therefore, there is room for improvement in the art.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the optical-electrical module. Moreover, in the drawings, like reference numerals designate corresponding parts throughout the several views. Wherever possible, the same reference numerals are used throughout the drawings to refer to the same or like elements of an embodiment.

DETAILED DESCRIPTION

Figure 1:
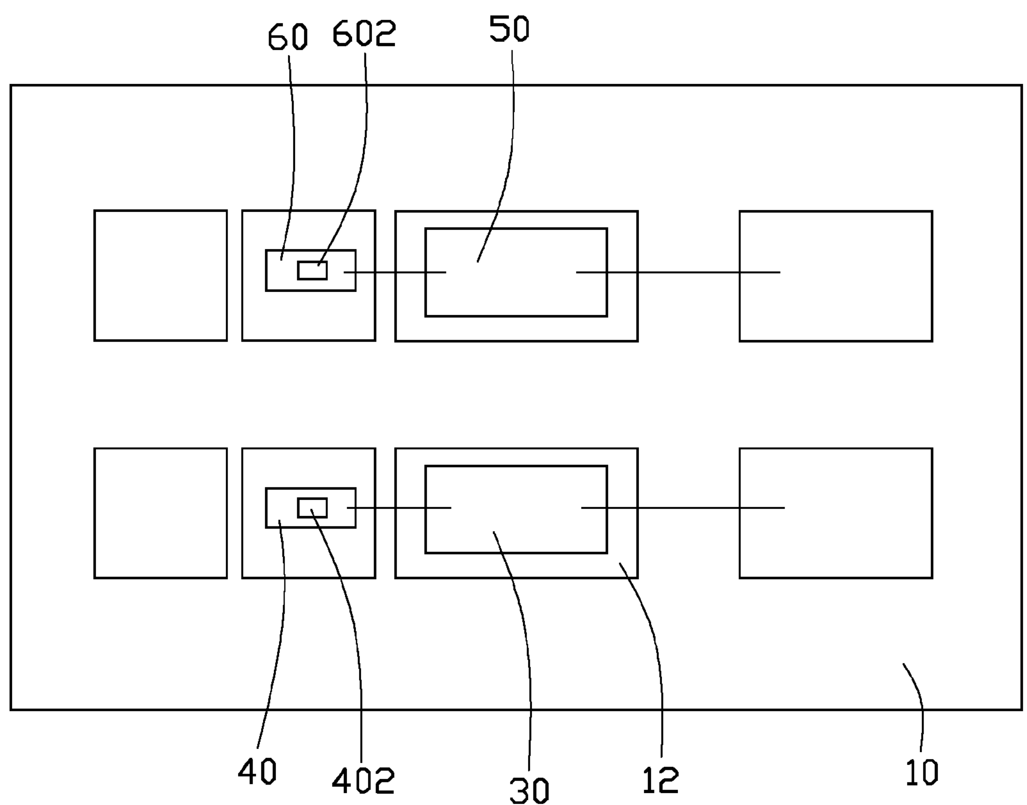
FIG. 1 is a top view of an embodiment of an optical-electrical module without a lens unit.
Figure 2:
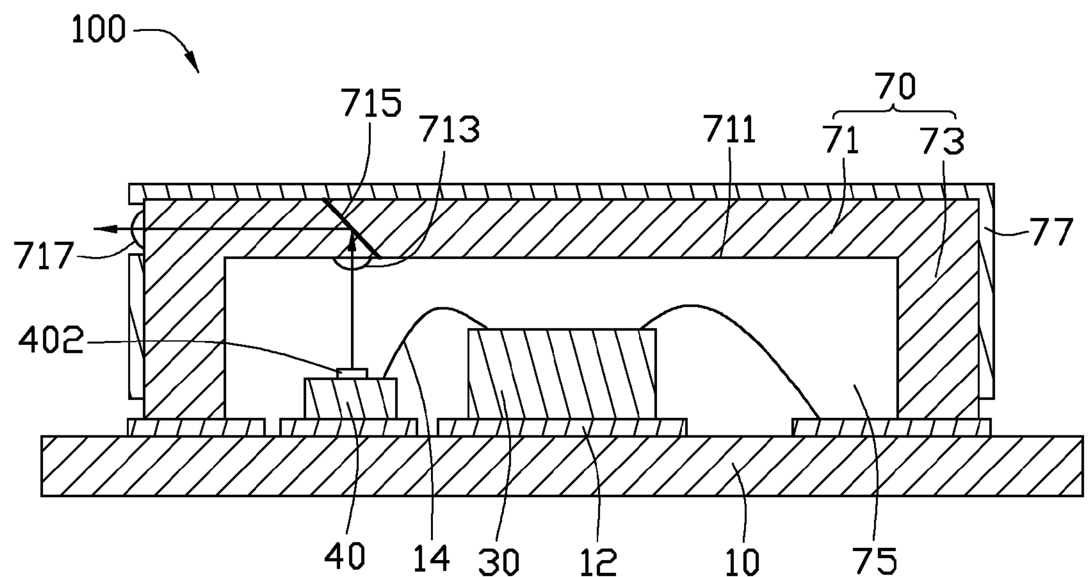
FIG. 2 is a cross-sectional view of an embodiment of an optical-electrical module.
Figure 3:
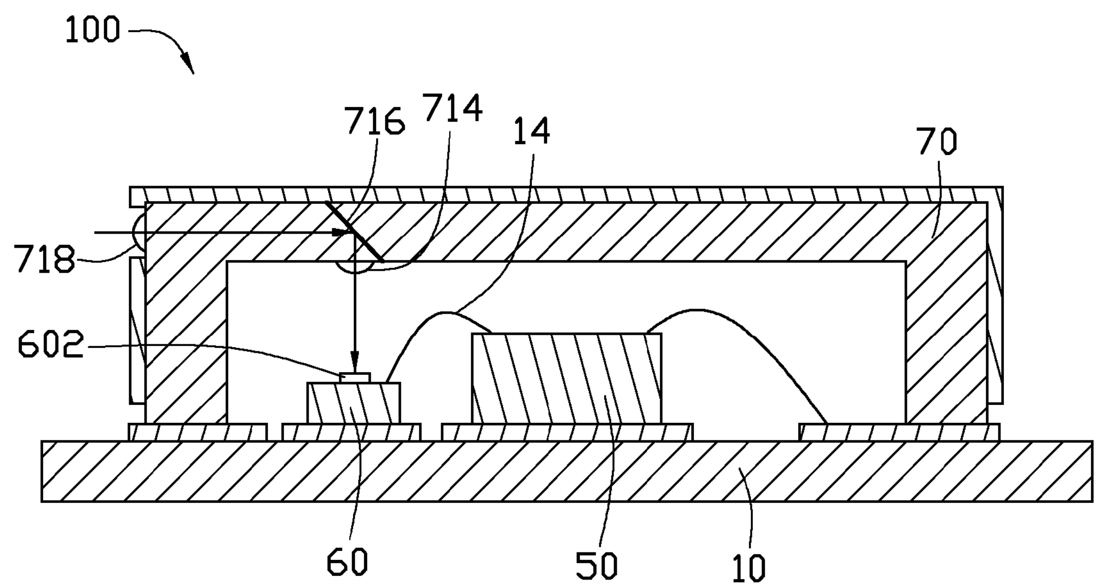
FIG. 3 is another cross-sectional view of the optical-electrical module of FIG. 1.

Referring to FIGS. 1 to 3, an embodiment of an optical-electrical module 100 for data transmission is shown. The optical-electrical module 100 includes a base board 10, an integrated circuit 30 fixed on the base board 10, a laser diode 40, a transimpedance amplifer 50 (as shown in FIG. 2), a photo diode 60 (as shown in FIG. 2), and a lens unit 70. The lens unit 70 and the base board 10 cooperatively define a receiving space 75 to receive the integrated circuit 30, the laser diode 40, the transimpedance amplifer 50, and the photo diode 60.

The base board 10 can be a printed circuit board. A plurality of solder masks 12 are formed on the surface of the base board 10. The integrated circuit 30 and the laser diode 40 are adjacent to each other and are both fixed on two separate solder masks 12. The integrated circuit 30 drives the laser diode 40 to transmit optical signals and is electrically connected to the laser diode 40 by a wire 14. The laser diode 40 defines a transmitting window 402 at an end of the laser diode 40 away from the base board 10. The laser diode 40 transmits optical signals through the transmitting window 402, and the optical signals are emitted in a direction substantially perpendicular to the base board 10.

The transimpedance amplifer 50 and the photo diode 60 are adjacent to each other and are both fixed on two separate solder masks 12. The transimpedance amplifer 50 is electrically connected to the photo diode 60 by a wire 14. The photo diode 60 defines a receiving window 602 at an end of the photo diode 60 away from the base board 10. The optical signals transmitted to the optical-electrical module 100 are received by the photo diode 60 through the receiving window 602 after convergence and transmission through the lens unit 70. The photo diode 60 changes the optical signals into electrical signals, which are then amplified by the transimpedance amplifer 50 and can be transmitted to other interfaces.

The lens unit 70 is fixed on the base board 10 and acts as a transmission medium for converging the optical signals transmitted by the laser diode 40 or received by the photo diode 60. The lens unit 70 can be made of transparent organic glass. The lens unit 70 includes a rectangular base plate 71 and four sidewalls 73 extending substantially perpendicular from the edges of the base plate 71. The four sidewalls 73 can be fixed to the base board 10 by solder masks 12 or an adhesive.

The base plate 71 can be substantially parallel to the base board 10. In the illustrated embodiment, the lens unit 70 further includes a first convex lens 713 formed on an inner surface 711 of the base plate 71 opposite the transmitting window 402, and a second convex lens 714 formed on the inner surface 711 of the base plate 71 opposite the receiving window 602. The lens unit 70 further includes a first reflector 715 formed in the interior of the base plate 71 adjacent to the first convex lens 713, and a second reflector 716 formed in the interior of the base plate 71 adjacent to the second convex lens 714. The lens unit 70 further includes a third convex lens 717 and a fourth convex lens 718 formed on an end surface of the base plate 71. The optical signals from the laser diode 40 are transmitted through the transmitting window 402 to the first convex lens 713, reflected by the first reflector 715, and then transmitted through the third convex lens 717. The optical signals transmitted through the fourth convex lens 718, reflected by the second reflector 716, and through the second convex lens 714, are received by the photo diode 60 through the receiving window 602.

Figure 4:
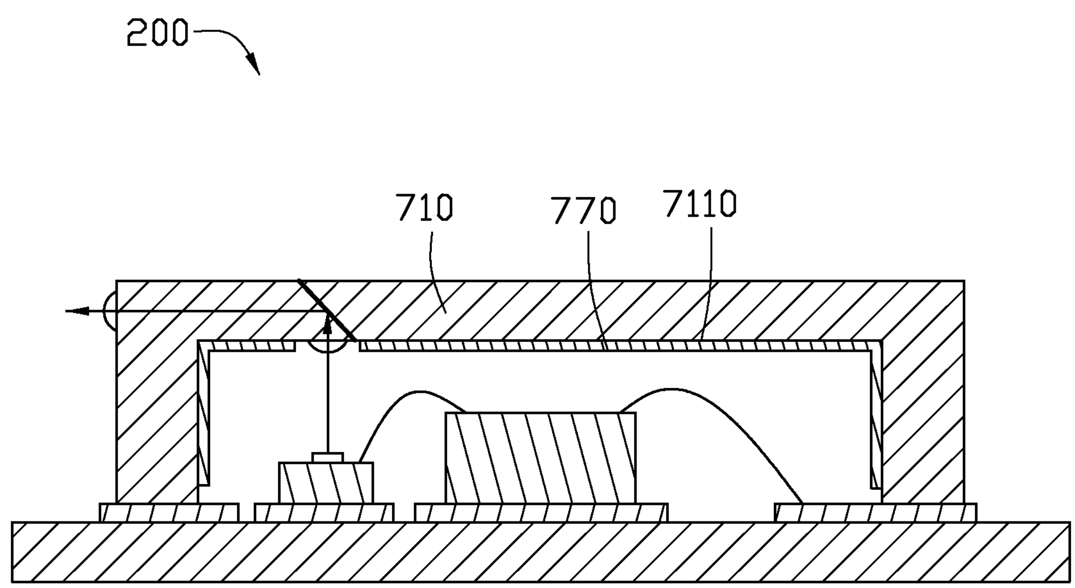
FIG. 4 is a cross-sectional view of an alternative embodiment of an optical-electrical module.

A metal film 77 for preventing EMI can be formed on the outer surface of the lens unit 70 by electroplating or physical vapor deposition. The metal film 77 is not formed on a light transmitting area of the lens unit 70 to allow optical signals to transmit through. The two convex lenses 717, 718 can be covered by a mask before electroplating to avoid coating the two convex lenses 717, 718 by the metal film 77. Each end of the four sidewalls 73 adjacent to the base board 10 can also be masked before electroplating to prevent the four sidewalls 73 from forming electrical connections to the base board 10 during electroplating. The metal film 77 can be a copper film, a nickel film, a zinc film, or an aluminum film. In alternative embodiments, as shown in FIG. 4, a structure of an optical-electrical module 200 is similar to the optical-electrical module 100, except that a metal film 770 can be formed on an inner surface 7110 of a base plate 710.

If the optical signals transmitted by the laser diode 40 are parallel to the optical signals received by the photo diode 60, the first and second convex lenses 713, 714 can be the same lens, the two third and fourth convex lenses 717, 718 can be the same lens, and the first and second reflectors 715, 716 can be the same reflector.

In one embodiment, the four convex lenses 713, 714, 717, 718 can be omitted. In alternative embodiments, the optical-electrical module 100 may include two or more laser diodes 40 or two or more photo diodes 60.

The metal film 77 formed on the lens unit 70 effectively contains the EMI of the optical-electrical module 100. The assembling efficiency for the optical-electrical module 100 is improved and the manufacturing cost of the optical-electrical module 100 is decreased because a metal housing covering the optical-electrical module 100 is omitted.

It is believed that the present embodiments and their advantages will be understood from the foregoing description, and it will be apparent that various changes may be made thereto without departing from the spirit and scope of the embodiments or sacrificing all of its material advantages.

What is claimed is:

1. An optical-electrical module, comprising:

a base board;

a laser diode fixed on the base board and having a transmitting window at an end of the laser diode away from the base board;

an integrated circuit driving the laser diode to transmit optical signals;

a lens unit converging and transmitting optical signals, the lens unit comprising a rectangular base plate, four sidewalls extending substantially perpendicular from the base plate, a first reflector, a first convex lens, and a second convex lens, wherein the four sidewalls are fixed to the base board, the first reflector is in an interior of the lens unit such that the first reflector reflects the optical signals transmitted from the laser diode and optical signals reflected from the first reflector are substantially parallel to the base board, the first convex lens is on the light transmitting area opposite to the transmitting window adjacent to the first reflector and is positioned in an interior of the rectangular base plate, and the second convex lens is at an end of the base plate converging the optical signals reflected by the first reflector; and a metal film formed on the inner surfaces of the lens unit except on the light transmitting areas, the metal film preventing the EMI leakage from the optical-electrical module.

2. The optical-electrical module of claim 1, further comprising a photo diode changing the optical signals into electrical signals and a transimpedance amplifier amplifying the electrical signals, and the photo diode having a receiving window at an end of the photo diode away from the base board.

3. The optical-electrical module of claim 2, wherein the lens unit further comprises a second reflector in an interior of the lens unit such that the second reflector reflects the optical signals received by the photo diode.

4. The optical-electrical module of claim 3, wherein the lens unit further comprises a third convex lens on the light transmitting area opposite to the receiving window and adjacent to the second reflector and a fourth convex lens at an end of the base plate converging the optical signals received by the photo diode.

5. The optical-electrical module of claim 1, wherein the laser diode transmits optical signals through the transmitting window perpendicular to the base board.

6. The optical-electrical module of claim 1, wherein the metal film is a copper film.

7. An optical-electrical module, comprising:

a base board;

a laser diode fixed on the base board and having a transmitting window at an end of the laser diode away from the base board;

an integrated circuit driving the laser diode to transmit optical signals;

a lens unit converging and transmitting optical signals, the lens unit comprising a rectangular base plate, four sidewalls extending substantially perpendicular from the base plate, a first reflector, a first convex lens, and a second convex lens, wherein the four sidewalls are fixed to the base board, the first reflector is in an interior of the lens unit such that the first reflector reflects the optical signals transmitted from the laser diode and optical signals reflected from the first reflector are substantially parallel to the base board, the first convex lens is on the light transmitting area opposite to the transmitting window adjacent to the first reflector and is positioned in an interior of the rectangular base plate, and the second convex lens is at an end of the base plate converging the optical signals reflected by the first reflector; and a metal film formed on the outer surfaces of the lens unit except on the light transmitting areas and preventing the EMI leakage from the optical-electrical module.

8. The optical-electrical module of claim 7, further comprising a photo diode changing the optical signals into electrical signals and a transimpedance amplifier amplifying the electrical signals, and the photo diode having a receiving window at an end of the photo diode away from the base board.

9. The optical-electrical module of claim 8, wherein the lens unit further comprises a second reflector in an interior of the lens unit such that the second reflector reflects the optical signals received by the photo diode.

10. The optical-electrical module of claim 9, wherein the lens unit further comprises a third convex lens on the light transmitting area opposite to the receiving window and adjacent to the second reflector and a fourth convex lens at an end of the base plate converging the optical signals received by the photo diode.

11. The optical-electrical module of claim 7, wherein the laser diode transmits optical signals through the transmitting window perpendicular to the base board.

12. The optical-electrical module of claim 7, wherein the metal film is a copper film.

13. An optical-electrical module, comprising:

a base board;

a laser diode fixed on the base board and having a transmitting window at an end of the laser diode away from the base board;

an integrated circuit driving the laser diode to transmit optical signals;

a lens unit converging and transmitting optical signals, the lens unit comprising a base plate, a plurality of sidewalls extending from the base plate and connected to the base board, and a first reflector positioned in an interior of the base plate; and a metal film preventing the EMI leakage from the optical-electrical module, wherein the base plate, the plurality of sidewalls, and the base board cooperatively define a receiving space to receive the laser diode and the integrated circuit, the base plate and the plurality of sidewalls have light transmitting areas, and the metal film is directly formed on the base plate and the plurality of sidewalls except on the light transmitting areas, and optical signals reflected from the first reflector are substantially parallel to the base board.

* * * * *